United States Patent [19]

Whitcomb

[11] 4,444,617
[45] Apr. 24, 1984

[54] REACTIVE ION ETCHING OF MOLYBDENUM SILICIDE AND N+ POLYSILICON

[75] Inventor: Eugene C. Whitcomb, Mission Viejo, Calif.

[73] Assignee: Rockwell International Corporation, El Segundo, Calif.

[21] Appl. No.: 456,183

[22] Filed: Jan. 6, 1983

[51] Int. Cl.$^3$ ............ H01L 21/306; B44C 1/22; C03C 15/00; C03C 25/06
[52] U.S. Cl. .................... 156/643; 156/646; 156/652; 156/657; 156/659.1; 204/192 E; 252/79.1
[58] Field of Search ............ 156/643, 646, 652, 657, 156/659.1, 662, 656, 664; 204/192 E, 192 EC; 427/38, 39; 252/79.1; 430/313

[56] References Cited

U.S. PATENT DOCUMENTS 3,971,684 7/1976 Muto .............................. 204/192 E
4,162,185 7/1979 Coburn et al. ...................... 156/643
4,208,241 6/1980 Harshbarger et al. .............. 156/643

OTHER PUBLICATIONS

IBM Technical Disclosure Bulletin, vol. 18, No. 6, Nov. 1975, RF Reactive Ion Etching of Polysilicon with Fluorocarbon Gas by J. A. Bonjur and T. A. Hansen, p. 1897.

R. H. Dennard, R. H. Gaensslen, H. N. Yu, V. L. Rideout, E. Bassons, and A. B. LeBlanc, "Design of Ion-Implanted MOSFET's with Very Small Physical Dimensions", IEEE J. Solid-State Circuits, vol. SC-9, 256–268, 1974.

R. H. Bruce, "Anisotropy Control in Dry Etching", Oct. 1981.

"Plasma Etching of Aluminum: Review of Process and Equipment Technology"; Aaron Weiss, 10/82 Semiconductor International, pp. 72 and 74.

Primary Examiner—William A. Powell
Attorney, Agent, or Firm—H. Fredrick Hamann; Daniel R. McGlynn

[57] ABSTRACT

An anisotropic etching processing for fabricating a solid state device which consists of the steps of providing a layer of silicon on the substrate and depositing a layer of molysilicide on the silicon layer. The molysilicide layer is then masked to define a pattern thereon. The unmasked portions of the molysilicide layer is then etched using a plasma etch gas mixture consisting essentially of $CF_4$, $C_2F_6$, $O_2$ in the approximate ratio 50:5:2 in percent by volume. Etching through polysilicon is performed anisotropically using a plasma etch gas mixture consisting essentially of $CCl_2F_2$ and $C_2F_6$ in approximately the ratio 10:1 in percent by volume.

14 Claims, 9 Drawing Figures

REACTIVE ION ETCHING OF MOLYBDENUM SILICIDE AND N+ POLYSILICON

BACKGROUND OF THE INVENTION

1. Field of the Invention

The invention relate to reactive ion etching processes used in the fabrication of solid state devices, and in particular to the fabrication of solid state devices incorporating a layer of molybdenum silicide ($MoSi_2$) or a layer of N+ polysilicon.

2. Description of the Prior Art

The use of wet or dry etching techniques, and in particular plasma etching and reactive ion etching, is well known in solid state technology for selectively removing materials during the fabrication of a patterned solid state device.

The areas of interest in etching materials are the control of geometric dimensions, selectivity in etching with reference to the underlying material and the photoresist, degradation of the photoresist, etch rate (which is a significant factor in throughput), and uniformity of the etch, both across a single wafer and from wafer-to-wafer. It is well documented in the prior art that wet etching techniques do not maintain the necessary linewidth control for the fine line geometries required for LSI or VLSI device fabrication. Wet etching, moreover, as a purely chemical etch, is completely isotropic. Anisotropic processes are needed for dimensional control of linewidth.

Plasma etching is a process in which a partial pressure of a gas is excited which creates a reactive gas plasma. This plasma then chemically reacts with the surface of the body to be etched.

In general, plasma etching techniques range from barrel etching to ion milling. Each of these techniques can be characterized by the degree to which the etch is either a chemical process or a physical process. Barrel etchers represent the extreme case of a purely chemical process similar to wet chemistry techniques. Like wet chemical etching, the results are isotropic etching which is unacceptable for etching aluminum because of poor dimensional control. Ion milling represents the other extreme of being a purely physical process where material is etched by means of ion bombardment only. Consequently there is little selectivity to the etching process; thus all materials are etched at approximately the same rate. In between the extremes of barrel etching and ion milling there is plasma etching, reactive ion etching (RIE), and reactive ion beam etching (RIBE).

A plasma system operating in the plasma etch mode can be defined by the reduced significance of energetic ion bombardment which results from various characteristics of the process. One such characteristic is the placement of the wafers on the anode, or grounded electrode. Secondly, this type of system generally operates at pressure above 200 microns. These characteristics reduce ion bombardment of the wafer surfaces, and therefore the process can be described as an ion assisted chemical process.

Reactive ion etching involves a significantly greater contribution of physical processes. In an RIE system the wafers are placed on the cathode which is driven by rf power. RIE is generally performed at pressures below 100 microns which increases the amount of energetic ion bombardment of wafer surfaces. In these systems the cathode will take on an average DC bias with respect to the plasma. Because of the energetic ion bombardment normally incident on the surface of the wafers, RIE systems have an inherent mechanism to achieve anisotropic etching.

Reactive ion beam etching entails an even greater extent of physical ion bombardment. In these systems the plasma is actually remote from the wafers to be etched. reactive ions are produced in a plasma and are extracted and directed at the surface of the wafers. This process differs from ion milling in that the species from which ions re produced are reactive gases rather than inert gases such as argon.

The significant advantage of plasma etching over ion milling or other mechanical etching techniques is that the different gases in the plasma generally have different etch rates and can be specifically selected as required for the process. Reactive ion beam etching (RIBE) is a combination of reactive ion etching and ion milling.

As a general rule the more chemical in nature the etch process is, the greater the selectivity between the material to be etched and the underlying material. Also, the more chemical in nature, the greater the tendency for the etch to be isotropic and the greater the amount of directionality inherent in the process.

The greatest impetus behind the switch from wet chemical etch techniques to dry plasma techniques has been the need for greater control in pattern definition. To obtain good transfer of patterns into the aluminum, undercutting must be eliminated, or in other words the etch must be anisotropic. In light of this need there has been a long standing controversy regarding the ability of the plasma etch mode to produce anisotropic etching.

Since plasma etch entails very little energetic ion bombardment, critics believe straight walls are not achievable, and thus many in the industry maintain the plasma etch mode is not the technique of choice for linewidths below 2 m.

Another factor is the nature of the material being etched. As the device feature size has been reduced, new limitations to device performance have been encountered. One significant limitation to device operation has been the relatively high resistance of polysilicon when used in scaled down interconnect structures. In recent years, efforts to surmount the resistance problem have resulted in rapid progress being made in the development of new low resistance materials for use as interconnects. The greatest advancements have been made using refractory metals and refractory metal silicides, with the most attention being given to $MoSi_2$, $TiSi_2$, $TaSi_2$ and $WSi_2$.

However, the gains that have been made in improving device performance with refractory metals or metal silicides have not been without a price. Polysilicon is successfully used as a device compatible material for many reasons, not the least of which is the fact that it can be easily patterned with relatively high selectivity over companion materials. That has not generally been true for refractory metals and their silicides. In order to achieve the precise pattern replication required for submicron geometry gates, dry processing technology must be employed. Attempts to dry process refractory metal silicide gates by either conventional plasma or reactive ion etch (RIE) techniques have often been less than satisfactory. In most devices employing refractory metal silicides, the gate metalization consists of the silicide on top of a heavily doped polysilicon layer. The etch process must therefore be anisotropic for both the silicide and the polysilicon, and have a very low relative SiO2 etch rate. Problems observed in etching this double layer structure are generally of three types. First the chemically active plasma species required to etch the refractory metal or silicide may result in an isotropic, rather than an anisotropic etch, which precludes adequate pattern dimensional control of the silicide. Second, the chemical attack of the underlying material such as N+ polysilicon may be several times faster than that of the refractory metal silicide layer, which can result in an isotropic etch condition that causes undercut voids in the structure. Finally, in instances where directional etching has been achieved for one or both of the gate structure materials, it has often been at the expense of selectivity. In such cases a failure mode may occur making it very difficult to stop the etch before penetrating the required thin oxide sublayer. Yet another severe problem is encountered when one attempts to use oxygen in a plasma-photoresist errosion. The photoresist etch is also completely isotropic leading to rapid loss of pattern stability.

SUMMARY OF THE INVENTION

Briefly, and in general terms, the invention relates to an anisotropic etching mode for fabricating a solid state device which consists of the steps of providing a layer of silicon on a substrate; depositing a layer of molysilicide on the silicon layer; and masking portions of the molysilicide layer to define a pattern thereon. More particularly, the invention provides the step of etching through the unmasked portions of the molysilicide layer using a plasma etch gas mixture consisting essentially of $CF_4$, $C_2F_6$, and $O_2$ in the ratio 50:5:2 in percent by volume.

In another embodiment of the invention, the invention relates to an anisotropic etching processing for fabricating a solid state device on a substrate which consists of the steps of providing a layer of silicon on the substrate; depositing a layer of polysilicon on the silicon layer; depositing a layer of molysilicide on said polysilicon layer; masking portions of the molysilicide layer to define a pattern thereon; etching through the unmasked portions of the molysilicide layer using a first plasma etch gas mixture consisting essentially of $CF_4$, $C_2F_6$, and $O_2$ in percent by volume in the range:

| $CF_4$ | 76–94% |
| $C_2F_6$ | 4–16% |
| $O_2$ | 2–8%; and | etching through the unmasked portions of the polysilicon layer using a second plasma etch gas mixture.

Yet another embodiment of the invention relates to an anisotropic etching method for fabricating a solid state device which consists of a layer of polysilicon together with a layer of molysilicide deposited on the polysilicon layer. The invention then provides the step of anisotropically etching through the unmasked portions of the molysilicide layer, followed by anisotropically etching through the unmasked portions of the polysilicon layer.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENT

Figure 1A:
FIGS. 1a through 1f are cross-sectional views of a composite during successive steps of processing including a molysilicide layer which is plasma etched according to techniques known in the prior art.

Referring now to FIG. 1a there is shown a cross-sectional view of a substrate on which is to be formed a composite of layered materials useful in forming solid state devices.

The substrate 10 may be of any suitable material such as a semiconductor material or the like, depending upon the solid state device to be implemented, or the particular process. For purposes of this explanation, the substrate 10 is considered to be silicon, either bulk silicon or silicon on another substrate, such as sapphire. The silicon layer may be of any suitable thickness.

Deposited on the surface of the silicon substrate 10 is a thin layer of dielectric material, such as a silicon dioxide layer $SiO_2$ 11, which is used in many silicon semiconductor circuits as a dielectric isolation material, such as a gate oxide. The silicon dioxide may be formed as a layer using known thermal oxidation techniques to a thickness to the order of 150 to 1500 angstroms. Of course any suitable technique for forming a dielectric layer on the surface of the substrate 10 is within the scope of the present invention.

Figure 1B:
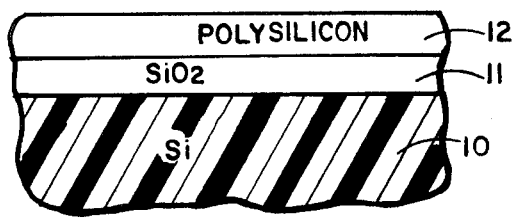

Referring next to FIG. 1b, a second layer 12 of material is provided on the composite over the layer 11 in any suitable fashion such as deposition. In the present embodiment, the second layer 12 is composed of polysilicon with a thickness of 1000 to 2500 angstroms. The polysilicon layer 12 may be formed from any suitable material consistent with the process. The layer 12 may be patterned according to techniques known in the art to form individual circuits or devices on the substrate at this point, or additional layers may be applied over the polysilicon layer 12. The subsequent discussion will describe the embodiment using at least one additional layer over the polysilicon.

Figure 1C:
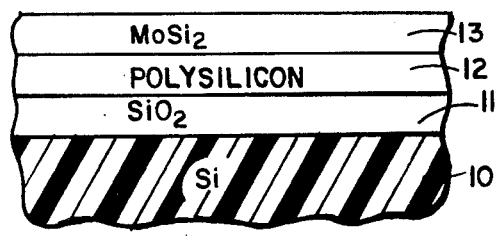

Referring next to FIG. 1c, a third layer 13 of material may be provided on the composite over the layer 12. In the present embodiment, the third layer 13 is composed of molybdenum silicide ($MoSi_2$). Molybdenum silicide (or molysilicide) is a refractory metal silicide providing low electrical resistance. Such a layer may be used as an interconnect in an integrated circuit.

Figure 1D:
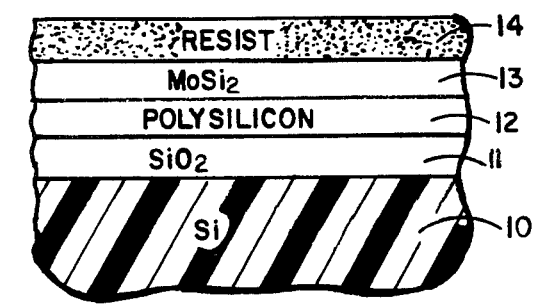
Figure 1E:
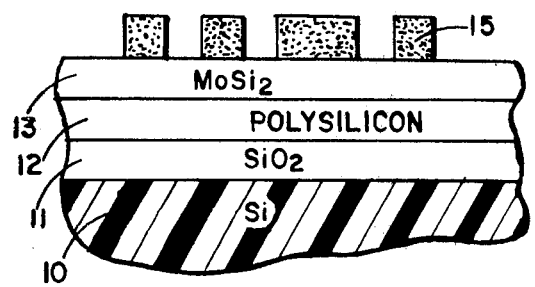

In order to fashion the molysilicide 13 layer into a suitable pattern, plasma etching or reactive ion etching (RIE) is used. A layer of a photo sensitive material such as photoresist is deposited over the layer 13, as shown in FIG. 1d. The photoresist is then patterned according to known techniques to form islands on regions 15 of photoresist shown in FIG. 1e. At this point the process steps according to the prior art and the process steps according to the present invention are substantially identical. The regions 15 of photoresist are used as a mask for the plasma etching or reactive etching process.

Figure 1F:
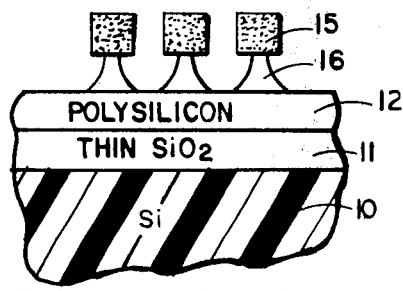

According to the prior art, a known plasma etching process applied to the molysilicide layer 13 will result in a isotropic etch of that layer to form molysilicide islands 16 below the corresponding regions 15 of the photoresist layer, as shown in FIG. 1f. It is noted from the figure that the islands 16 are substantially undercut beneath the photoresist regions 15, and as a result the linewidth of the molysilicide regions shown in cross-section in FIG. 1f is highly variable.

Figure 2A:
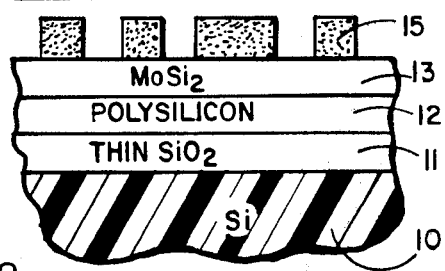
FIGS. 2a through 2c are cross-sectional views of a similar composite during successive steps of processing including plasma etching according to the present invention.

Turning now to the corresponding process step according to the present invention, the present invention begins with the same pattern of islands or regions 15 of photoresist as in the prior art, and now represented in FIG. 2a. However, according to the present invention the plasma gas mixture consists essentially of $CF_4$, $C_2F_6$, and $O_2$ in the ratio 50:5:2 in percent by volume. The result of using such a plasma etch gas mixture on the composite shown in FIG. 2a is the etch of the molysilicide layer 13 to form regions of molysilicide 17 corresponding to the photoresist mask regions 15 shown in FIG. 2b.

Figure 2B:
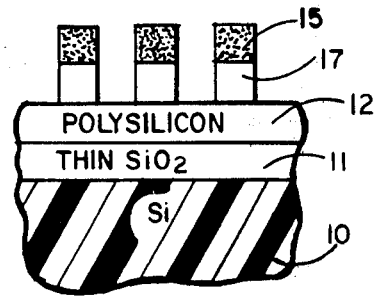

As shown in FIG. 2b, the etch is anisotropic for the $MoSi_2$ material and has an etch selectivity of 14:1 for N+ polysilicon over $SiO_2$. The errosion rate of AZ1350J and AZ1400 photoresists in this etch is slow enough to maintain pattern integrity while etching 0.7 m wide patterns up to 4000 angstroms deep.

Although the use of such a gas mixture with the ratio 50:5:2 is preferred, a plasma gas mixture of $CF_4/C_2F_6/O_2$ with the mixture ratios between 50:10:4 and 50:3:2 has been determined to be effective for etching $MoSi_2$ in an anisotropic manner, and are within the scope of the present invention as well.

Another way of expressing the preferred gas mixture of $CF_4$, $C_2F_6$ and $O_2$ is the following volumetric percentages:

| | |
|---|---|
| $CF_4$ | 89% |
| $C_2F_6$ | 7% |
| $O_2$ | 4% |

Other mixture ratios have been evaluated and it has been determined that anisotropic etching of $MoSi_2$ can be obtained with a $C_2F_6$ mixture content between 4% and 16%, and $O_2$ content between 2% and 8%. More particularly, the plasma etch gas mixture consists essentially of $CF_4$, $C_2F_6$, and $O_2$ in percent by volume in the range:

| | |
|---|---|
| $CF_4$ | 76-94% |
| $C_2F_6$ | 4-16% |
| $O_2$ | 2-8% |

Figure 2C:
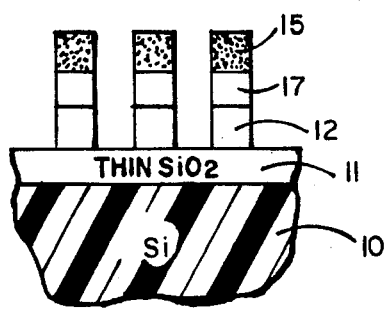

Turning next to FIG. 2c, an anisotropic plasma etch of the polysilicon layer 12 is shown. The plasma etch gas mixture to etch the N+ polysilicon consists essentially of $CCl_2F_2$ and $C_2F_6$ in the ratio 10:1 in percent by volume. As shown in FIG. 2c, the etch is anisotropic for the N+ polysilicon material, therefore permitting the linewidths to be highly controlled. Another feature of the present invention is the composite of the plasma etch gas mixture for etching the N+ polysilicon as described herein.

It will be obvious to those skilled in the art that the semiconductor process according to the present invention can be implemented with various semiconductor technologies and different combinations of known processes steps, and that the preferred embodiments illustrated here are merely exemplary. The thickness of the layers, as well as the concentrations of dopant species, and/or their concentration profiles, can be chosen depending upon the desired properties. These and other variations can be further elaborated by those skilled in the art without departing from the scope of the present invention.

The present invention is also not restricted to the specific semiconductor materials and circuits described. For example, it may be pointed out that semiconductor materials other than silicon, for example $A_{III}$-$B_V$ compounds, may be used.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. An anisotropic etching processing for fabricating a solid state device on a substrate comprising the steps of:
providing a layer of silicon on said substrate;
depositing a layer of molysilicide on said silicon layer;
masking portions of said molysilicide layer to define a pattern thereon; and
etching through the unmasked portions of said molysilicide layer using a plasma etch gas mixture consisting essentially of a mixture of $CF_4$, $C_2F_6$, $O_2$ in percent by volume in the range:

| | |
|---|---|
| $CF_4$ | 76-94% |
| $C_2F_6$ | 4-16% |
| $O_2$ | 2-8% |

2. A process as defined in claim 1 wherein said layer of silicon consists of N+ polysilicon.

3. The process as defined in claim 1, wherein said layer of silicon consists of monosilicon.

4. The process as defined in claim 1, wherein said masking step comprises depositing a layer of photoresist over said molysilicide layer and etching said photoresist layer to form a pattern.

5. A method as defined in claim 4 further comprising the step of subsequently stripping the remaining portions of said layer of photoresist.

6. A method as defined in claim 1, wherein said mixture of $CF_4$, $C_2F_6$, and $O_2$ in percent by volume is approximately in the ratio 50:5:2.

7. A gas for use in reactive ion etching of molysilicide consisting essentially of:
$CF_4$, $C_2F_6$, and $O_2$ in percent by volume in the range:

| | |
|---|---|
| $CF_4$ | 76-94% |
| $C_2F_6$ | 4-16% |
| $O_2$ | 2-8% |

8. A gas as defined in claim 1, consisting essentially of the composition, in percent by volume, of approximately:

| | |
|---|---|
| CF$_4$ | 89% |
| C$_2$F$_6$ | 7% |
| O$_2$ | 4% |

9. An anisotropic etching processing for fabricating a solid state device on a substrate comprising the steps of:

providing a layer of silicon on said substrate;

depositing a layer of polysilicon on said silicon layer;

depositing a layer of molysilicide on said polysilicon layer;

masking portions of said molysilicide layer to define a pattern thereon;

etching through the unmasked portions of said molysilicide layer using a first plasma etch gas mixture consisting essentially of CF$_4$, C$_2$F$_6$, and O$_2$ in percent by volume in the range:

| | |
|---|---|
| CF$_4$ | 76–94% |
| C$_2$F$_6$ | 4–16% |
| O$_2$ | 2–8%; and | etching through the unmasked portions of said polysilicon layer using a second plasma etch gas mixture.

10. An anisotropic etching processing for fabricating a solid state device on a substrate comprising the steps of:

providing a layer of silicon on said substrate;

depositing a layer of N+ polysilicon on said silicon layer;

masking portions of said polysilicon layer to define a pattern thereon;

etching through the unmasked portions of said polysilicon layer using a plasma etch gas mixture consisting essentially of CCl$_2$F$_2$, and C$_2$F$_6$ in the ratio 10:1 in percent by volume.

11. The process as defined in claim 10, wherein said layer of silicon consists of monosilicon.

12. The process as defined in claim 10, wherein said masking step comprises depositing a layer of photoresist over said polysilicon layer and etching said photoresist layer to form a pattern.

13. A method as defined in claim 12, further comprising the step of subsequently stripping the remaining portions of said layer of photoresist.

14. A gas for use in reactive ion etching of polysilicon consisting of substantially of:

CCl$_2$F$_2$, and C$_2$F$_6$ in the ratio 10:1 in percent by volume.

* * * * *